United States Patent [19]

Fisher et al.

[11] Patent Number: 4,731,738

[45] Date of Patent: Mar. 15, 1988

[54] MEMORY TIMING AND CONTROL APPARATUS

[75] Inventors: Edwin P. Fisher, N. Abington; Ralph G. Schuberth, Bedford, both of Mass.

[73] Assignee: Honeywell Information Systems Inc., Waltham, Mass.

[21] Appl. No.: 466,272

[22] Filed: Feb. 14, 1983

[51] Int. Cl.[4] .............................................. G06F 12/00
[52] U.S. Cl. .................................................... 364/200
[58] Field of Search ....... 364/200 MS FILE, 900 MS FILE;
365/230, 189

[56] References Cited

U.S. PATENT DOCUMENTS

| | | | |
|---|---|---|---|
| 4,164,786 | 9/1979 | Gollomp | 364/200 |
| 4,200,919 | 4/1980 | Page et al. | 365/200 |
| 4,245,263 | 1/1981 | Rathbun et al. | 364/45 |
| 4,296,467 | 10/1981 | Nibby, Jr. et al. | 364/200 |
| 4,365,294 | 12/1982 | Stokken | 364/200 |
| 4,368,515 | 1/1983 | Nielsen | 364/200 |
| 4,473,877 | 9/1984 | Tulk | 364/200 |
| 4,475,176 | 10/1984 | Ishii | 364/900 |
| 4,503,491 | 3/1985 | Lushtak et al. | 364/200 |
| 4,606,003 | 8/1986 | Daniels | 364/200 |

OTHER PUBLICATIONS

Short; K. L., Microprocessors and Programmed Logic, Prentice Hall, 1981, pp. 48, 49.

*Primary Examiner*—Thomas M. Heckler
*Attorney, Agent, or Firm*—Faith F. Driscoll; John S. Solakian

[57] ABSTRACT

A memory board can be assembled with one, two or more rows of memory chips to provide a corresponding number of different memory capacities for expanding the capacity of main memory which resides on a basic logic board containing the processing units and other units of a system. The memory board includes a programmable read only memory (PROM) circuit which receives as inputs from the basic logic board a predetermined address portion of each memory address together with memory refresh and timing signals. The PROM circuit is coded in a predetermined manner for generating at its output terminals row address select (RAS) pulse output signals to a row or block of memory chips designated by the predetermined address portion. The pulse widths of the output signals are established by the timing signal applied to an enabling terminal of the PROM.

30 Claims, 6 Drawing Figures

| PROM 400 | | | | | |
|---|---|---|---|---|---|
| INPUTS | | OUTPUTS | | | |
| NO. 0-3 L6AD00-L6AD03 | NO.4 REFR | NO.0 RAS64 | NO.2 RAS128 | NO.4 RAS192 | NO.6 MEMORY PRESENT |
| $0000_{16}$ | 0 | 1 | 1 | 1 | 1 |
| $0001_{16}$ | 0 | 0 | 1 | 1 | 0 (64K, 128K & 192K OPTIONS) |
| $0010_{16}$ | 0 | 1 | 0 | 1 | 0 (128K & 192K OPTIONS) |
| $0011_{16}$ | 0 | 1 | 1 | 0 | 0 (192K OPTION) |
| $0100_{16}$ | 0 | 1 | 1 | 1 | 1 |
| $0101_{16}$ ↓ $1111_{16}$ | 0 ↓ 0 | 1 ↓ 1 | 1 ↓ 1 | 1 ↓ 1 | 1 ↓ 1 |
| DON'T CARE | 1 | 0 | 0 | 0 | 1 |

MEMORY TIMING AND CONTROL APPARATUS

BACKGROUND OF THE INVENTION

1. Field of Use

This invention pertains to memory systems and more particularly to circuits for controlling the operation of such systems.

2. Prior Art

It is well known that as systems become more complex due to increases in system functionality, delays related to levels of logic circuits and registers, interconnections and packaging use up greater percentages of a system's cycle time. In an effort to reduce delays, efforts have been made to concentrate the control circuits of systems in fixed locations within such systems by employing programmable logic arrays (PLAs), programmable read only memories PROMs and read only memories ROMs, etc.

Such concentration has been primarily limited to the processing units and peripheral controller units wherein PLAs, PROMs and ROMs are used to perform largely decoding functions. An example of such use of PROMs may be found in U.S. Pat. No. 4,245,263 which is assigned to the same assignee as named herein.

While such arrangements reduce considerably the amount of logic circuits, it has been found that such systems still require additional levels of registers and/or logic circuits for generating desired sequences of timing signals. This becomes especially important in memory systems where rows of memory chips must receive timing signals for predetermined periods of time for proper operation.

The proper generation of timing signals becomes even more complicated when the memory system is not located on the same printed circuit board as the system. Hence, considerable amounts of board space must be allocated to control and timing circuits thereby decreasing the amount of board space for the expansion of memory capacity.

Accordingly, it is a primary object of the present invention to provide a memory system which has a minimal amount of circuit complexity.

It is a further object of the present invention to provide a memory system which includes apparatus for generating the desired sequence of timing signals with minimum delay.

It is a more specific object of the present invention to provide a memory board which can expand the capacity of a host main memory system and be constructed as required with minimum circuit complexity.

SUMMARY OF THE INVENTION

The above and other objects and advantages of the present invention are achieved in a preferred embodiment of the present invention in which one, two or more rows of memory chips are contained on a memory option board which plugs into a basic logic board (BLB) of a data processing system. The base logic board includes the system's main memory processing units and other control and logic support circuits.

According to the teachings of the present invention, the memory option board is constructed to include within a control section a programmable read only memory (PROM) circuit which is connected to receive from the different units of the basic logic board, a predetermined address portion of each main memory address in addition to refresh and timing signals. The PROM is coded in a predetermined manner for generating row address select (RAS) pulse output signals to a row or block of random access memory chips of the board's memory section designed by the predetermined address portion. The pulse widths of the output signals are established by the widths of the input timing signals applied to an enabling input of the PROM.

The same memory board can be used to expand the capacity of main memory by different amounts as a function of the PROM coding constructed with different numbers of rows of chips. This greatly enhances memory security and maintains system integrity since a memory board with a particular memory capacity can only be accessed by a PROM specially coded to provide that capacity. Also, the pulse width of the PROM output signals can be increased or decreased as required for accommodating different types of memory chips (e.g. 64K or 256K) by simply increasing or decreasing the width of the timing signals applied to the PROM enabling terminal.

Additionally, as mentioned, the basic main memory resides on the basic logic board and provides a given addressing capacity. When the predetermined address portion of the memory address specifies an address within the basic main memory, the PROM apparatus automatically inhibits its generation of output signals thereby ensuring proper memory operation without requiring any additional circuits.

When the refresh signal from the basic logic board indicates that main memory is to perform a refresh cycle of operation, the PROM apparatus of the present invention automatically forces all of its output signals to an active state for the duration of the timing signal applied to its enable input terminal. Thus, the rows of memory chips are refreshed without requiring additional circuits.

In addition to the above, the PROM apparatus of the present invention can be used to generate a memory present signal back to the main memory addressing control circuit of the basic main memory for indicating that the particular row or block of memory chips being addressed is present. This ensures that only valid memory cycles are performed by the system notwithstanding which part of memory is being addressed.

The apparatus of the present invention accomplishes all of the above control operations with a minimum of apparatus and complexity. Therefore, the invention reduces considerably the amount of board space that must be allocated permitting a wider range of memory expansion options.

The novel features which are believed to be characteristic of the invention, both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE PREFERRED EMBODIMENT

Figure 1:
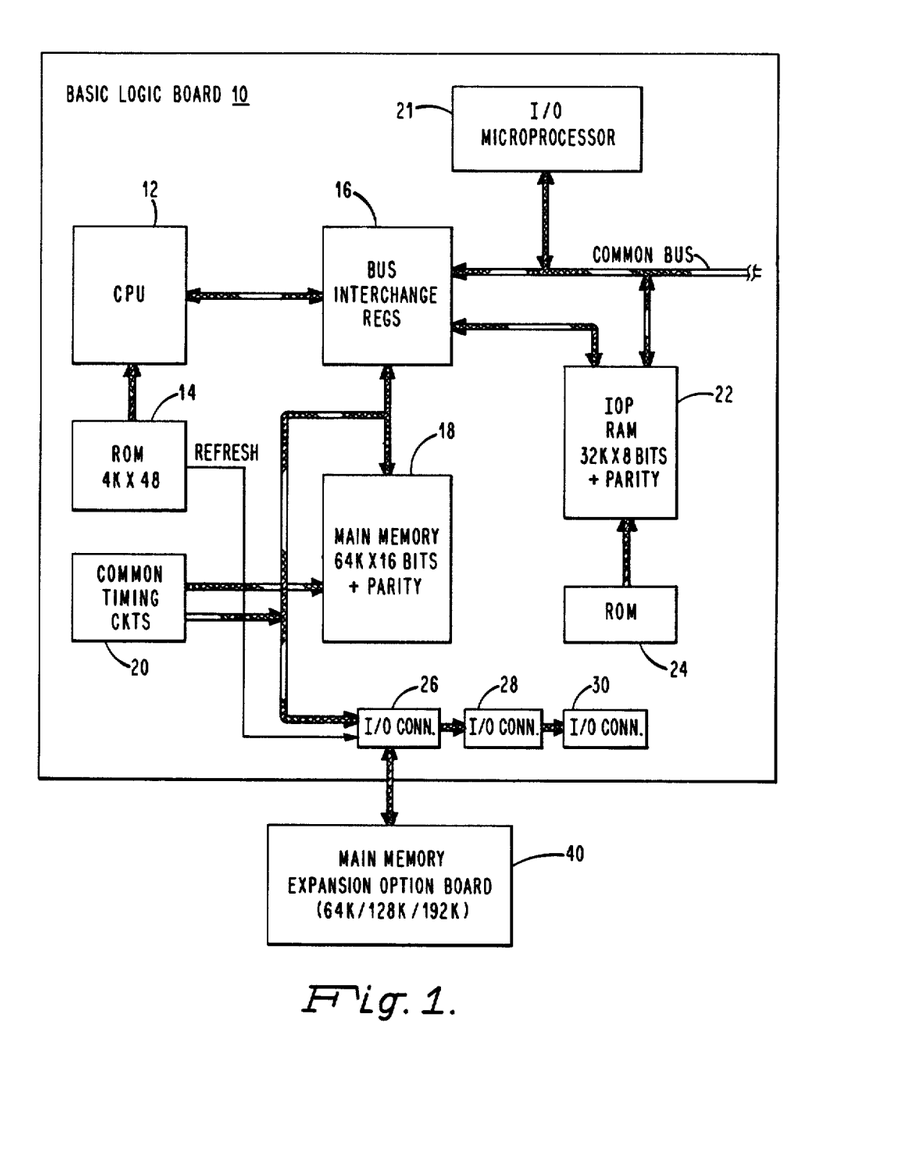
FIG. 1 is a block diagram of a data processing system which utilizes the memory board of the preferred embodiment of the present invention.

FIG. 1 shows some of the units of the data processing system mounted on a basic logic board 10 which employs the memory board of the preferred embodiment of the present invention. As shown, the board 10 includes a central processing unit 12 constructed from a single chip and associated read only memory (ROM) 14, an input/output processing unit 21 having a random access memory 22 and ROM 24 and a basic main memory 18 which couples to the timing circuits of block 20. Each of the units 12, 18, 20 and 22 couple to bus interchange registers included within block 16 which, in turn, couples to a common bus. Also, board 10 includes receptacles or sockets 26, 28 and 30 into which a corresponding number of option boards are inserted. One such option board 40 is the preferred embodiment of the present invention.

Since the other option boards as well as most of the units of FIG. 1 are not pertinent to an understanding of the present invention, they will not be discussed further herein. For additional information about the system of FIG. 1, reference may be made to the copending patent application of James C. Siwik, Thomas L. Murray, Jr. and Thomas O. Holtey, titled "Firmware Simulation of Diskette Data Via a Video Signal", Ser. No. 06/445,631, filed on Nov. 30, 1982, which is assigned to the same assignee as named herein.

The basic main memory 18 includes 64K words or 128K bytes of memory constructed from a row of 64K memory chips. Each memory word has 16 bits, divided into two 8-bit bytes and two parity bits, one for each byte. The capacity of the basic main memory 18 is expandable from 64K words to 128K words/192K words/256K words by adding memory option board 40 populated to contain 64K words/128 K words/192K words of memory storage.

The memory option board 40 plugs into the socket of a pair of I/O connectors which includes connector 26 and receives the required address, data, control and timing signals from the different units of FIG. 1.

Figure 2:
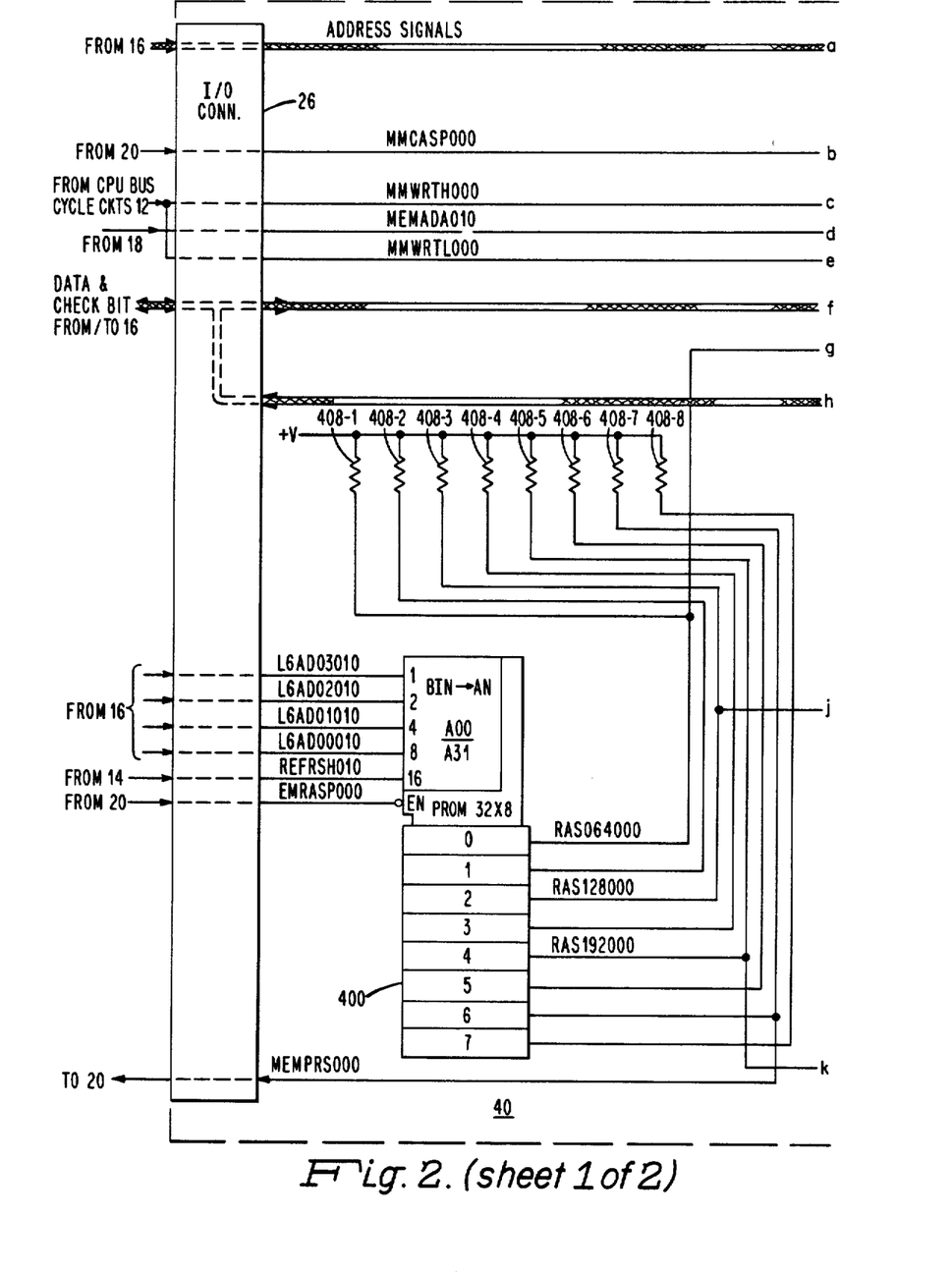
FIG. 2, consisting of sheets 1 and 2, shows in greater detail, the memory board of the preferred embodiment of the present invention.

Memory Option Board 40—FIG. 2

Referring to FIG. 2, it is seen that the memory expansion board 40 of the preferred embodiment includes an I/O connector 26 which plugs into the socket of basic logic board 10. The board 40 has a control section and a memory section. The control section of board 40 includes a PROM 400 which has five address input terminals (1,2,4,8 and 16) and an enable input terminal (En) for addressing any one of 32 locations, each location containing eight bits. The PROM 400 is constructed from a standard vendor PROM chip such as the Intersil 5610 chip manufactured by Intersil Incorporated.

Each of the output terminals 0–7 of PROM 400 connects through a corresponding one of eight termination resistors 408-1 through 408-8 to a voltage +V. Additionally, selected output terminals are connected to the row address select (RAS) input terminals of the random access memory (RAM) chips from one up to three rows includable in the board's memory section. More specifically, the same memory board 40 may be assembled for expanding the 64K word capacity of basic main memory 18 by 64K words, 128K words or by 192K words of storage. In the case of 64K words, board 40 is only populated with memory chips 402-1 through 402-18 of row B. For 128K words, board 40 is additionally populated with memory chips 404-1 through 404-18 or row C. Lastly, for 192K words, board 40 is fully populated with the memory chips of rows B and C, in addition to memory chips 406-1 through 406-18 of row D. The basic main memory 18 is assumed to contain the memory chips of row A.

As seen from FIG. 2, for all three memory expansion options, PROM output terminal 0, connects to the RAS input terminals of memory chips 402-1 through 402-18 of row B. For the second and third memory expansion options, PROM output terminal 2 connects to the RAS input terminals of memory chips 404-1 through 404-18 of row C. For the third memory expansion option, PROM output terminal 4 connects to the RAS input terminals of memory chips 406-1 through 406-18 of row D. Additionally, in the case of all three memory expansion options, PROM output terminal 6 connects to I/O connector 26 for furnishing a memory present signal to the memory address control circuits of block 20 of board 10.

All of the memory chips of the populated rows are connected to receive a column address select (CAS) timing signal MMCASP000 from the circuits of block 20, a pair of memory write control signals MMWRTH000 and MMWRTL000 from the CPU bus cycle circuits of block 12 and a memory signal MEMAOA010 from the refresh control circuits of block 18. As indicated, signal MMCASP000 is applied to the CAS input terminals of all of the memory chips. To control refresh operations externally, signal MEMAOA010, applied to the RFE input terminals of these chips, is maintained in a high state. When the board 40 is populated with 256K RAM chips, signal MEMAOA010 is used as a ninth input address signal.

Memory write signal MMWRTH000 is applied to the WE input terminals of the first eight memory chips of each populated row (e.g. chips 402-1 through 402-8) and the seventeenth memory chip (e.g. 402-17) of that row. These chips provide storage for the high order byte and parity bit associated therewith. Memory write signal MMWRTL000 is applied to the WE input terminals of remaining memory chips of each populated row. These memory chips provide storage for the low order byte and parity bit associated therewith.

The address input terminals 0–7 of each 64K RAM chip are connected to receive eight bit row and column address portions of each memory address via I/O connector 26 from the circuits of block 16. When board 40 is populated with 256K RAM chips, 9-bit row and column address portions will be applied by the circuits of block 16. Additionally, the 16 data bits and two parity bits of each data word to be written into memory during each memory write cycle of operation are applied via I/O connector 26 to the data input terminals of the memory chips of each populated row. The 16 data and two parity bits of each data word to be read out from memory during each memory read cycle of operation are applied by the data output terminals of the memory chips of each populated row to I/O connector 26 for transfer to the circuits of block 16.

Each 64K memory chip contains a number of storage arrays organized in a matrix of 512 rows by 512 columns of storage cells. Accessing one of the 65,536 (64K) storage locations of a chip is accomplished in two steps as discussed herein. In the first step, 512 storage locations of a complete row is read out into 512 sense amplifier circuits located on the chip. In a second step, one of the 512 1-bit storage locations latched in the sense amplifier circuits is read out to the chip's data out terminal Do. For further information regarding the internal operation of 64K chips, reference may be made to the publication titled "The MOS Memory Data Book" by Texas Instruments Incorporated, Copyright 1980.

Now, the construction and coding of PROM 400 will be discussed in greater detail. The first four address bits of each memory address which are coded to specify the block or row of memory being addressed are applied to the input terminals designated "1" through "8" of PROM 400. Accordingly, address signal L6AD00010 corresponds to the most significant bit of each main memory address. Input terminal 16 of PROM 400 receives as a fifth address bit, refresh signal REFRSH010 from CPU ROM 14.

Figure 3:
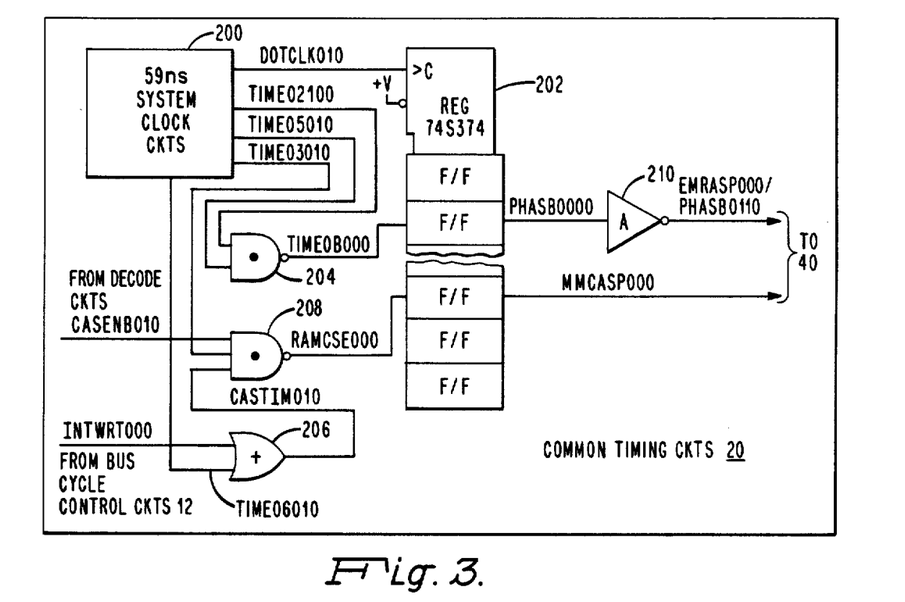
FIG. 3 shows a portion of the timing and control circuits of the data processing system of FIG. 1.
Figure 4:
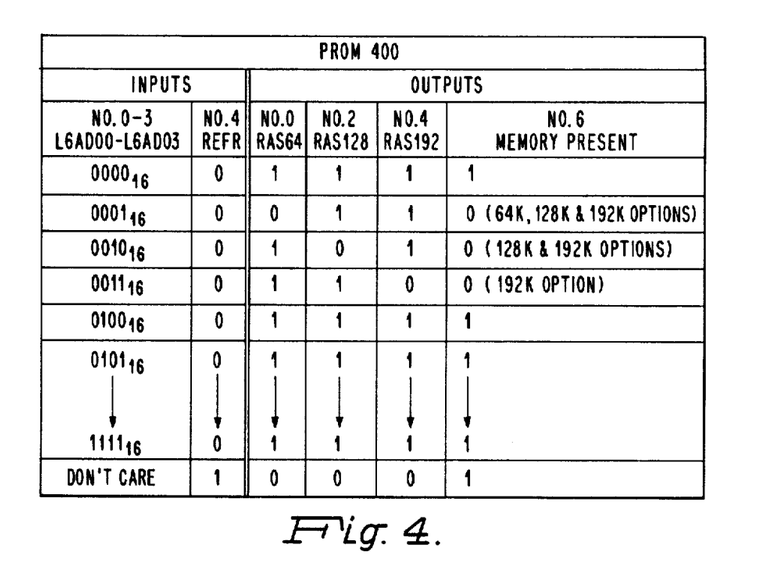
FIG. 4 illustrates the coding of the PROM apparatus of the preferred embodiment of the present invention.

In accordance with the teachings of the present invention, a timing signal EMRASP000 generated by the circuits of block 20 shown in FIG. 3 is applied to the enable terminal EN of PROM 400. The pulse width of signal EMRASP000 establishes the widths of the signals appearing at the output terminals 0-7 of PROM 400. FIG. 4 shows the states of signals applied to PROM output terminals 0, 2, 4 and 6 in response to the 32 possible different values or patterns of signals which can be applied to the PROM input terminals designated "1" through "16".

In FIG. 4, a "1" corresponds to a no output which is represented by the voltage level +V. A "0" corresponds to an output which is represented by the voltage level of zero volts. As seen from FIG. 4, when a signal REFRSH010 is a "0" and a hexidecimal address of "0000" is applied to the PROM input terminals, the result is that all 1's appear at PROM output terminals 0, 2, 4 and 6. That is, storage location having address "0" stores the pattern of bits which provides the indicated signals at the PROM output terminals. For the same value of signal REFRSH010 and a hexidecimal address of "0001", the addressed PROM location forces PROM output terminals 0 and 6 to 0's while the remaining PROM output terminals remain 1's. When the hexidecimal address changes to "0010", the addressed location forces PROM output terminals 2 and 6 to 0's. PROM output terminals 4 and 6 are forced to 0's when the hexidecimal address changes to "0011". For the hexidecimal addresses 0100 through "1111", the addressed locations revert PROM output terminals 0, 2, 4 and 6 back to all 1's. Lastly, when signal REFRSH010 is a 1, no matter what hexidecimal address is applied, all of the addressed locations force PROM output terminals 0, 2 and 4 to 0's while causing output terminal 6 to remain a "1". That is, the remaining storage locations are coded to contain the same pattern of bits.

It will be appreciated that the exact coding of the PROM 400 will be altered according to the particular memory expansion option being provided. That is, all of the "0" outputs indicated in FIG. 4 will be provided when board 40 is assembled with three rows of memory chips to provide a memory expansion of 192K words. For a memory expansion of 128K words, the response to hexidecimal address 0011 will be changed accordingly. In addition to this change, the response to hexidecimal address "0010" will also be changed for a memory expansion of 64K words.

This arrangement provides a certain degree of memory security, since a specially coded PROM is required to operate with each different memory expansion board option. PROM programming is accomplished in a conventional manner. For further information, reference may be made to the publication titled "Intersil Semiconductor Products Catalog" by Intersil Inc., dated October, 1974.

FIG. 3 shows a portion of the circuits of block 20 of FIG. 1 which are used in the generation of timing signals EMRASP000 and MMCASP000. As shown, the system clock circuits of block 200 generate a 59 nanosecond width clock signal DOTCLK010 which is used to synchronize the operations of the different units of FIG. 1. Additionally, these circuits generate sequences of timing signals TIME01 through TIME06.

Different ones of the timing signals are combined within a pair of NAND gates 204 and 208 and an OR gate 206 to produce signals TIMEOB000 and RAMCSE000. More specifically, timing signal TIME6010 is ORed with an internal write signal INTWRT000 from the bus cycle control circuits of CPU 12 to produce column address select timing signal CASTIM010. The signal CASTIM010 is combined in NAND gate 208 with a column address select enable signal from decoder circuits, not shown, included in block 20 and a timing signal TIME03010. This results in the generation of signal RAMCSE000 which is applied as one input to one stage of an 8-bit register 202.

NAND gate 204 combines timing signals TIME02100 and TIME05010 to produce signal TIMEOB000. This signal is applied as an input to another stage of register 202. The states of both signals are loaded into the stages of register 202 in response to signal DOTCLK010 which is applied to a clocking input (c) of the register. The timing signal TIMEOB000 following inversion by an inverter circuit 210 and timing signal RAMCSE000 are applied as signals EMRASP000 and MMCASP000 respectively to memory board 40. For the purpose of the present invention, the generation of these signals can be considered conventional as explained herein.

DESCRIPTION OF OPERATION

Figure 5:
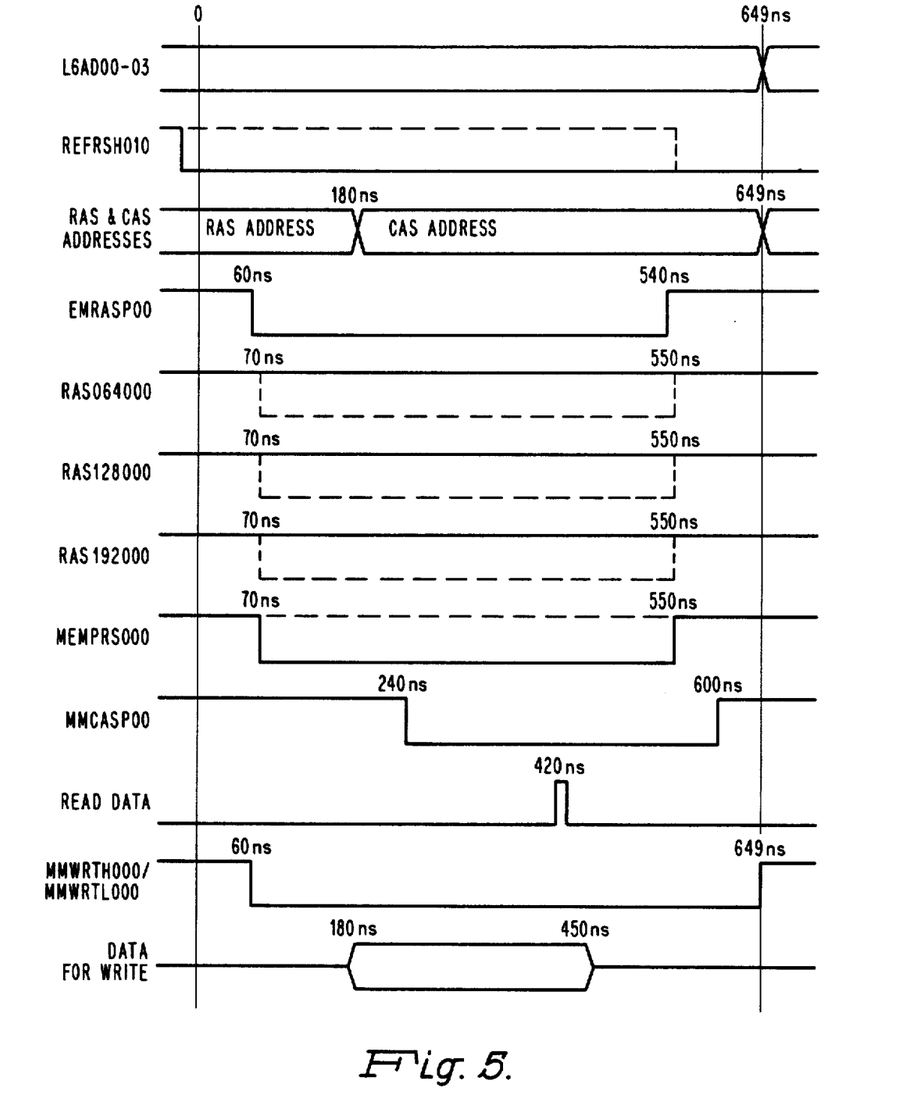
FIG. 5 is a timing diagram used to illustrate the operation of the memory board of the preferred embodiment of the present invention.

With reference to FIGS. 1-4 and the timing diagram of FIG. 5, the operation of the preferred embodiment will now be described. Referring to FIG. 5, it is seen that at time 0, the 8-bit row address of a main memory address is applied to the memory chips of rows B, C and D of FIG. 2. Also at that time, address bits 0-4 corresponding to the most significant portion of the same memory address are applied to input terminals 1-8 of PROM 400.

At that time, refresh address signal REFRSH010 is a "0" or goes to 0 volts. PROM 400 operates to force one or none of its output terminals to a "0" as a function of the value of address signals L6AD00-03. That is, when all of these signals are zeros specifying the selection of an address within the first row or block of memory chips (first 64K address space) included in basic main memory 18, PROM 400 forces none of its output terminals to 0's as indicated in FIG. 4 in response to RAS timing signal EMRASP00.

The permits the system of FIG. 1 to process the memory address as if board 40 was not present in the system. That is, PROM 400 automatically inhibits the operation of memory expansion option board 40 notwithstanding it being enabled by timing signal EMRASP00 generated by the circuits of FIG. 3.

That is, the signals applied to the PROM input terminals address a storage location which contains a pattern or code that results in no outputs being present at its output terminals. Therefore, none of the memory chips of rows B, C and D receive a RAS timing signal. In the absence of the RAS timing signals, the first half of an access cycle for a complete row of 512 storage locations within each memory chip of the rows B, C and D is inhibited. Thus, the RAS address portion applied to all of the memory chips is not strobed into row address buffer circuits internal to the chips. Accordingly, no "row selection" can take place and hence no information can be subsequently written into or read from the memory chips of rows B, C and D. That is, the circuit storage nodes of all of the row decoder and column decoder circuits internal to the memory chips are not precharged.

However, when signals L6AD00-03 have one of the hexidecimal values "0001", "0010" or "0011", PROM 400 is conditioned by timing signal EMRASP00 to force one of the signals RAS064000, RAS128000 or RAS192000 low as illustrated by the dotted portions of these signals in FIG. 5. The RAS signal is generated soon after the change of state in timing signal EMRASP00 signalling that the RAS address is valid. During the first half of the memory access cycle which corresponds to the interval defined by the width of timing signal EMRASP00, the precharging and the selection of a complete row of 512 storage locations of each memory chip of the specified one of the rows B, C or D occur enabling read out to the memory sense amplifier circuits of the chips of the specified row.

After 180 nanoseconds, the row address is replaced by the 8-bit column address as illustrated in FIG. 5. As soon as the column address is valid, column address strobe (CAS) signal MMCASP00 generated by the circuits 20 of FIG. 3 goes low. At that time, the 8-bit column address is latched into the column buffer circuits. The result is that during a read cycle of operation (i.e., when both signals MMWRTH000 and MMWRTL000 remain high (Do) one of the 512 1-bit locations held by the sense circuits of each chip is read out to the data out terminal of each of the chips of the selected row. As seen from FIG. 5, this occurs approximately 420 nanoseconds later. Thus, an information word consisting of 16 data and two parity bits is forwarded to unit 16 of board 20 via I/O connector 26. Also, PROM 400 forces memory present signal MEMPRS000 low which signals circuits within block 20 that the source of the word is memory board 40.

The board 40 performs a write cycle upon being addressed in the same two-step access cycle when write signals MMWRTH000 and MMWRTL000 are forced low by the circuits of block 12. Each of the signals MMWRTH000 and MMWRTL000 cause a different half word or byte of the data word received via I/O connector to be written into the memory chips of the selected row.

As indicated in FIG. 5, the data is valid at approximately 80 nanoseconds. As in the case of a read cycle, PROM 400 forces memory present signal MEMPRS000 low. This signals circuits within block 20 that the data word is to be written into the circuits of memory board 40.

It will be noted that in the case of a refresh cycle of operation, signal REFRSH010 is forced high by the circuits of block 14. The refresh command remains valid from time 0 for an interval of 649 nanoseconds. As seen from FIG. 4, signal REFRSH010 when high causes PROM 400 to reference a location which forces PROM output terminals 0, 2 and 4 low and output terminal 6 high for an interval defined by signal EMRASP00. During the refresh cycle, only the first portion of the two-step access cycle is performed. That is only the row address is applied to all of the memory chips of all populated rows B, C and D. This address is strobed into the row buffer circuits of all memory chips in response to the row address stroke (RAS) timing signals appearing at the PROM output terminals. The result is that one complete row of the 512 rows within each of the chips of rows B, C and D is accessed. This is effective to refresh the same row of memory cells within all of the populated rows of memory chips.

During the refresh cycle, the circuits of block 12 are prevented from generating CAS timing signal EMCASP000 while at the same time write signals MMRTH000 and MMRTL000 remain high. It will be appreciated that during the refresh cycle, memory present signal MEMPRS000 remains high indicating that the memory board is not available for performing a memory cycle of operation. Thus, the circuits of board 20 treat memory board 40 as if it was not connected in the system. For proper memory operation, each of the 512 rows are refreshed within a 4 millisecond period. For the purpose of the present invention, refresh cycles can be assumed to be initiated in a conventional manner.

From the above, it can be seen how the memory expansion board of the present invention is constructed to provide a number of expansion options and still require a minimum of circuits. This is carried out by employing PROM apparatus which is specially coded to operate in conjunction with a required number of rows of memory chips selected to provide the desired expanded memory capacity.

This arrangement maintains memory security by requiring that the PROM be coded to provide the specific memory expansion option (e.g. one row/block/64K expansion, two rows/blocks/128K expansion or three rows/blocks/192K expansion).

Substantial reduction of memory system complexity is achieved by having the PROM apparatus directly generate row address strobe timing signals required to perform the two-step access of memory chip storage locations. According to the teachings of the invention, a single input timing signal is used to directly control the duration of the RAS signals generated by the PROM apparatus making it possible to make any timing adjustments necessary for the proper operation of the memory expansion option board.

It will be obvious to those skilled in the art that many changes may be made to the preferred embodiment of the present invention. For example, the invention may be implemented with functionally equivalent programmable circuits such as programmable logic arrays (PLAs), random access memories (RAMs), etc. Also, the invention may be expanded to provide decoding and timing for different sizes of memory options and memory chips.

While in accordance with the provision and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A memory option board for use in a processing unit which is included as part of a basic logic board, said basic logic board having a main memory including a plurality of storage locations defining an initial memory capacity for said processing unit, said memory option board pluggable into said basic logic board for expanding said initial memory capacity of said processing unit, said main memory and option board storage locations being addressable by the same plurality of address signals, said memory option board comprising:

at least one row of memory chips, each row of chips providing a plurality of storage locations corresponding to a predetermined amount of expanded memory, and each of said memory chips of said one row including a row address strobe (RAS) input terminal; and, an addressable programmable array having a plurality of locations including information coded for specifying an amount of expanded memory for said processing unit being provided by said option board, said programmable array having;

a plurality of input terminals connected to receive a portion of said same plurality of address signals for accessing storage locations within said main memory unit and said option board during a memory cycle;

an enabling input terminal connected to receive a timing signal from said basic logic board; and a number of output terminals, a predetermined one of said number of output terminals being connected to said RAS input terminal of each of said chips of said row, said programmable array in response to each portion of said plurality of address signals and said timing signal received from said logic board during said memory cycle generating an output signal at said predetermined one of said number of output terminals for an interval defined by the duration of said timing signal, the state of said output signal defining when access to storage locations within said one row of memory chips by said plurality of address signals is permitted.

2. The memory option board of claim 1 wherein said plurality of address signals includes a row address and a column address and said timing signal applied to said enabling input terminal of said programmable array is a row address selection signal, said row address selection signal defining a first half of a memory access cycle during which said row address is to be strobed into said memory chips.

3. The memory option board of claim 2 wherein said portion is coded to specify when said one row of memory chips is being accessed, said programmable array in response to a first binary value of said portion inhibiting the generation of output signals at said number of output terminals as if said memory option board was not present within said data processing unit.

4. The memory option board of claim 3 wherein said first binary value specifies a storage location within said main memory.

5. The memory option board of claim 4 wherein said first binary value corresponds to an all ZEROS value.

6. The memory option board of claim 3 wherein said programmable array in response to a second binary value of said portion generates said output signal at a first one of said number of output terminals, said memory chips of said one row being simultaneously enabled by said output signal to store said row address during said first half of said memory access cycle.

7. The memory option board of claim 6 wherein said second binary value is "0001".

8. The memory option board of claim 1 wherein another one of said number of output terminals couples to said basic logic board, said programmable array in response to said portion generating said output signal on said another one of said number of output terminals for signalling the presence of said option board to said processing unit when said portion is coded to specify a memory storage location within said memory option board.

9. The board of claim 1 wherein a predetermined one of said plurality of input terminals of said programmable array is connected to receive a command signal from said processing unit indicating a memory refresh cycle of operation, said programmable array being operative in response to said command signal to simultaneously generate said output signal at said number of said output terminals for conditioning said memory chips within said row to perform a memory refresh cycle of operation.

10. A memory option board for expanding an initial memory capacity of a main memory unit having a plurality of storage locations defining said initial memory capacity, said storage locations being addressable by the same plurality of address signals, said unit being included as part of a basic logic board into which said option board plugs, said option board including:

a memory section having from one up to a predetermined number of rows of memory chips, said rows of chips providing a plurality of storage locations corresponding to a predetermined amount of expanded memory, and each of said memory chips of each of said rows including a row address strobe input terminal; and, a control section including:

an addressable programmable memory having a plurality of locations, said locations including information coded for specifying said amount of expanded memory included on said option board, said programmable memory having a plurality of input terminals connected to receive a portion of said same plurality of address signals used for accessing storage locations within said main memory and said memory section during each memory cycle, an enabling input terminal connected to receive a timing signal from said logic board and a plurality of output terminals, each output terminal being connected to said row address strobe input terminal of each of said chips of a predetermined one of said predetermined number of rows and said programmable memory in response to each portion of said plurality of address signals and said timing signal received from said logic board generating an output signal at a selected one of said output terminals for an interval defined by the duration of said timing signal, the state of said output signal defining when access to storage locations within said row of memory chips specified by said portion is permitted.

11. The memory option board of claim 10 wherein said address signals include row and column addresses and said timing signal applied to said enabling input terminal of said programmable memory is a row address selection signal, said row address selection signal defining a first half of a memory access cycle during which said row address is strobed into said memory chips of one of said predetermined number of rows specified by said portion.

12. The memory option board of claim 11 wherein said portion is coded to specify which row of memory chips is being accessed, said programmable memory in response to a second binary value generating an output signal at a first one of said output terminals, said row address strobe input terminals of said memory chips of a first one of said predetermined number of rows being connected to said first one of said output terminals and said chips being simultaneously conditioned by said output signal to store said row address during said first half of said memory access cycle.

13. The memory option board of claim 12 wherein said programmable memory in response to a third binary value generates said output signal at a second one of said output terminals, said row address strobe input terminals of memory chips of a second one of said predetermined number of rows being connected to said second one of said output terminals and said chips being simultaneously conditioned by said output signal to store said row address during said first half of said memory access cycle.

14. The memory option board of claim 13 wherein said programmable memory in response to a fourth binary value generates an output signal at a third one of said output terminals, said row address strobe input terminals of said memory chips of a third one of said predetermined number of rows being connected to said third one of said output terminals and said chips being simultaneously conditioned by said output signal to store said row address during said first half of said memory access cycle.

15. The memory option board of claim 14 wherein said fourth binary value is "0011".

16. The memory option board of claim 13 wherein said third binary value is "0010".

17. The memory option board of claim 12 wherein said second binary value is "0001".

18. The memory option board of claim 11 wherein said portion is coded to specify which row of memory chips is being accessed, said programmable memory in response to a first binary value of said portion inhibiting the generation of any output signals at said plurality of output terminals as if said memory option board was not present.

19. The memory option board of claim 18 wherein said first binary value specifies a storage location within said main memory unit.

20. The memory option board of claim 19 wherein said first binary value corresponds to an all ZEROS value.

21. The memory option board of claim 10 wherein a fourth one of said plurality of output terminals couples to said basic logic board, said programmable memory in response to said portion generating an output signal on said fourth one of said output terminals for signalling the presence of said memory option board to said basic logic board when said portion is coded to specify a memory storage location within said amount of expanded memory provided by said memory option board.

22. The memory option board of claim 21 wherein said programmable memory generates an output signal at said fourth one of said output terminals when said portion is coded to have binary values of "0001", "0010" and "0011".

23. The memory option board of claim 10 wherein said predetermined number of rows of chips is one and wherein said rows are populated with 64 K RAM chips for expanding said initial capacity of said main memory unit by an additional 64K words of expanded memory, said row address strobe terminals of said memory chips being connected to a first one of said plurality of output terminals.

24. The memory option board of claim 10 wherein said predetermined number of rows of chips is two and wherein said rows are populated with 64K RAM chips expanding said initial capacity of said main memory unit by an additional 128K words of expanded memory, said row address strobe terminals of said memory chips of first and second ones of said rows respectively being connected to first and second ones of said plurality of said output terminals.

25. The memory option board of claim 10 wherein said predetermined number of rows of chips is three and wherein said rows are populated with 64K RAM chips expanding said initial capacity of said main memory unit by an additional 192K words of expanded memory, said row address strobe terminals of said memory chips of first, second and third ones of said rows respectively being connected to first, second and third ones of said plurality of said output terminals.

26. The memory action board of claim 10 wherein a predetermined one of said plurality of input terminals of said programmable memory is connected to receive a command signal from said logic board indicating a memory refresh cycle of operation, said programmable memory in response to said command signal simultaneously generating said output signals at said plurality of output terminals for conditioning said memory chips within each of said predetermined number of rows to perform a memory refresh cycle of operation.

27. A method of constructing a memory option board which expands the initial memory capacity of a primary system which is addressable by n number of address signals by a number of different increments of memory, said method comprising the steps of:
 (a) constructing said memory option board to include a memory section and a control section;
 (b) mounting in said memory section, m rows of addressable memory chips for expanding said inital memory capacity by said different increments of memory, each chip having a row address strobe (RAS) input terminal;
 (c) mounting in said control section, a programmable read only memory (PROM) having an enabling input terminal, n number of input terminals, $2^n$ number of storage locations, each containing at least n number of bit locations, and m number of output terminals connected to said RAS terminals of a corresponding one of said m rows;
 (d) coding said $2^n$ storage locations of said PROM, for providing output signals for enabling said m rows of memory chips for access as a function of a preselected increment of expanded memory being provided by said board memory section; and, (e) connecting said enabling input terminal and said n number of input terminals to receive a timing signal and said n number of address signals from said primary system for conditioning said PROM to generate output signals on different ones of said m number of output terminals, each of said output signals having a duration established by said timing signal and the stages of said output signals enabling access to memory locations in said rows specified by the coding of said address signals only for said preselected increment of expanded memory being provided thereby maintaining system integrity.

28. The method of claim 27 wherein the most significant one of said n address signals is a refresh command signal and said method further includes the step of coding a number of locations accessed in response to said refresh command for simultaneously generating output signals at said m number of output terminals for enabling said m rows of memory chips to perform a refresh memory cycle of operation.

29. The method of claim 28 wherein each of said $2^n$ storage locations including an additional bit location, said method further including the step of coding each additional bit location for signalling when storage locations within said preselected increment of expanded memory are being addressed.

30. The method of claim 27 wherein n and m have the values 4 and 3 respectively and said step (d) includes coding successive addressed locations of said PROM with the values "111", "011", "101" and "110" for generating said output signals for said preselected increment of expanded memory.

* * * * *